United States Patent [19]
Ansel et al.

[11] Patent Number: 5,860,118
[45] Date of Patent: Jan. 12, 1999

[54] SRAM WRITE PARTITIONING

[75] Inventors: George M. Ansel; Andrew L. Hawkins; James E. Kelly, all of Starkville, Miss.

[73] Assignee: Cypress Semiconductor Corp., San Jose, Calif.

[21] Appl. No.: 756,270

[22] Filed: Nov. 25, 1996

[51] Int. Cl.$^6$ ................................................. G06F 12/02
[52] U.S. Cl. ........................................ 711/154; 711/104
[58] Field of Search .................................... 711/154, 155, 711/144, 104; 365/189.01, 230.01, 230.03

[56] References Cited

U.S. PATENT DOCUMENTS

| 5,042,004 | 8/1991 | Agrawal et al. | 395/590 |
| 5,535,164 | 7/1996 | Adams et al. | 365/201 |

OTHER PUBLICATIONS

"A Circuit Design Of Intelligent Cache Dram With Automatic Write–Back Capability"IEEE Journal of Solid–State Circuits. vol. 26, No. 4, Apr. 1991 pp. 560–565.

*Primary Examiner*—Eddie P. Chan
*Assistant Examiner*—Kevin L. Ellis
*Attorney, Agent, or Firm*—Maiorana & Acosta, P.C.

[57] ABSTRACT

A circuit and method for generating a global write enable signal for use in an SRAM partitioning scheme. The global write enable signal is generated by taking a combination of the individual write enable signals and presenting them as a global write control. The global write control signal allows all of the particular data groups to have common timing. The particular SRAM data groups may implement configuration dependent functionality which can be grouped with other data partitions in the array. A particular SRAM data group may share local decode and write control circuitry with other data groups. Particular SRAM data groups not selected for writing have their write data inputs driven to an inactive state during the WRITE.

16 Claims, 4 Drawing Sheets

SRAM WRITE PARTITIONING

FIELD OF THE INVENTION

The present invention relates to SRAM partitioning generally, and more particularly, to an SRAM write partitioning structure for generating a global write control.

BACKGROUND OF THE INVENTION

A typical static random access memory (SRAM) is broken down into several divisions and several banks. SRAMs are often used in tag memory applications to store the upper address bits of main memory data locations indicating which pieces of data from the main memory are stored in the cache memory. When a particular piece of data is to be retrieved, the address of the data is compared to the addresses stored in the tag memory. If the data address matches the address stored in the tag memory, a "cache hit" occurs and the data is retrieved from the cache memory. Since the SRAM cache is generally faster than the main memory, overall system performance is generally enhanced. In a situation where there is a cache miss (i.e., an attempt to access a main memory location that is not in the cache) it is necessary to fetch the memory location from the main memory and place it in the cache so that the data at this address is readily accessible for the next access. This process is generally called a cache line fill. To accomplish a cache line fill, it is necessary to write the upper address bits of the main memory location into the tag. In this case the least recently used (LRU) bit in the tag determines where in the cache to write the data so that there is a minimum impact on system performance. Whenever there is a cache read hit, the LRU bit is updated.

The two methods of updating data stored in cache memory during a WRITE operation are generally referred to as "write through" and "write back". For a write through, the information is simply written to the main memory at the same time it is written to the cache. However, the write through process generally takes longer to accomplish than writing to the cache since the main memory is generally slower. During a write back, the data is written to the cache and the main memory is only updated as needed. Generally, the tag must keep track that a particular address location in the cache is a dirty location, indicating it has been changed and is not the same as the corresponding main memory location.

Referring to FIG. 1, a circuit 10 is shown illustrating a write control system. The circuit 10 generally comprises a set of write buffers 12a and 12b, a pair of global or write control blocks 14a and 14b, a number of tag groups 16a, 16b, 16c and 16d, a number of tag groups 18a, 18b, 18c and 18d and a number of decode and local write control logic blocks 20a~20h. The tag groups 16a~16d and 18a~18d are subdivisions of the tag RAM address space. The write control block 14a is shown presenting a signal to the tag groups 18a~18d while the write control 14b is shown presenting a signal to the tag groups 16a~16d. The tag groups 16a~16d generally represent a bank "0" while the tag groups 18a~18d generally represent a bank "1" where each bank is a functional subdivision of the tag bits (e.g., LRU, dirty and tag address data). A separate write control block 14 is generally required for each bank (i.e., bank "0" and bank "1"). The write control 14a generally receives a write enable signal WE1 while the write control block 14b generally receives a write enable signal WE2. If each of the tag groups 16a~16d and 18a~18d are single functioning locations, only two write control blocks 14a and 14b may be required. However, if any of the particular tag groups 16a~16d or 18a~18d are implemented as multi-use bits, additional write control blocks 14 will be required. The larger the number of different multi-use bits present, the greater the number of write control blocks 14 that will be required. In a system where five global write controls would be required, the overhead in replicating all of the control lines from the write control blocks 14a~14b would be excessive.

SUMMARY OF THE INVENTION

The present invention concerns a circuit and method for generating a global write enable signal for use in an SRAM partitioning scheme. The global write enable signal is generated by taking a combination of the individual write enable signals and presenting them as a global write control. The global write control signal allows all of the particular data groups to have common timing. The particular SRAM data groups may implement configuration dependent functionality which can be grouped with other data partitions in the array. A particular SRAM data group may share local decode and write control circuitry with other data groups. Particular SRAM data groups not selected for writing have their write data inputs driven to an inactive state during the WRITE.

The objects, features and advantages of the present invention include providing a single write control circuit that drives an entire SRAM memory, presents a global write control signal that minimizes the number of routes necessary to implement the memory, provides common timing for each data partition and allows grouping of functionally independent data partitions so that they share local decode and write control circuitry.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
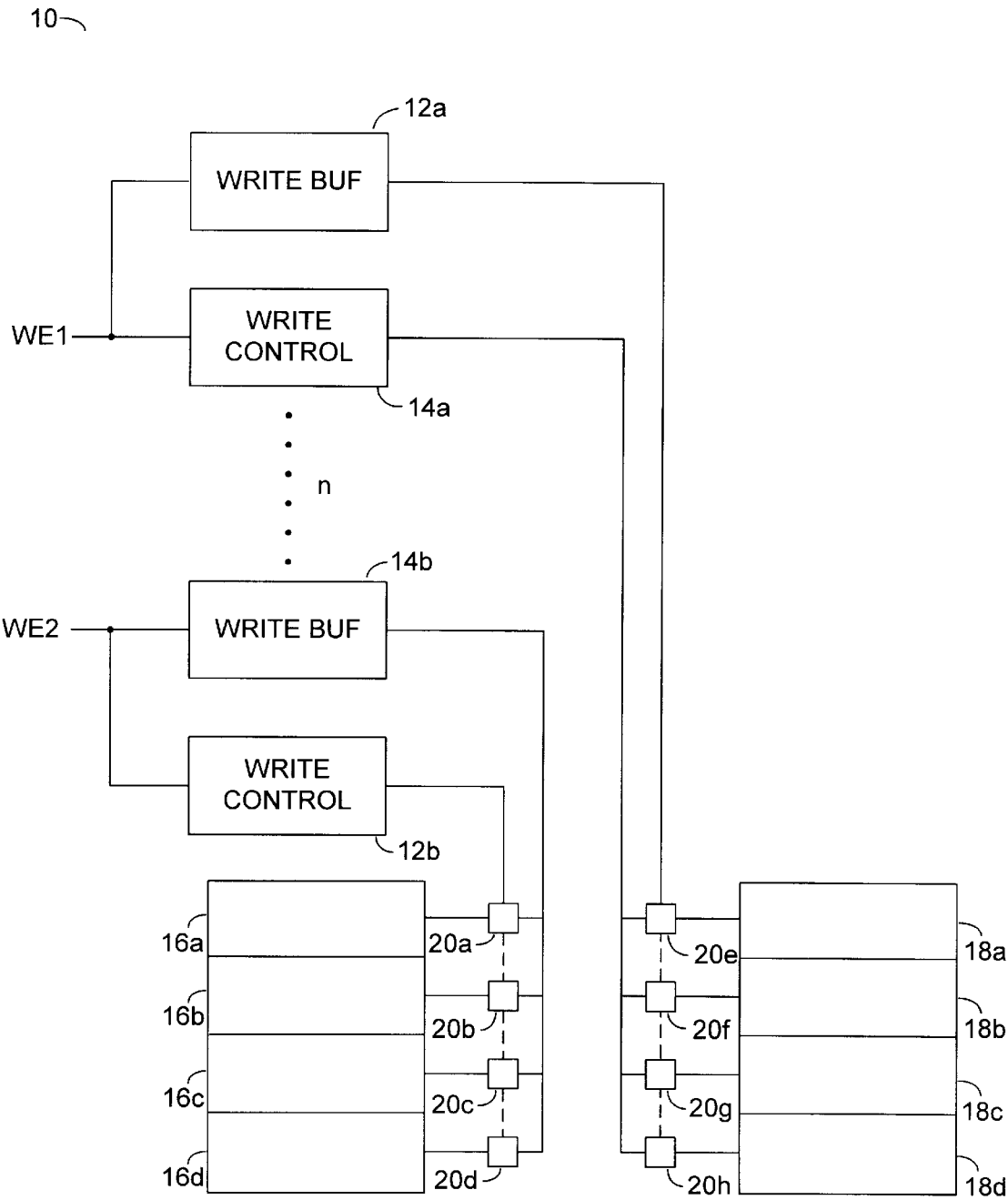
FIG. 1 is a block diagram of a previous approach partitioning circuit.
Figure 2:
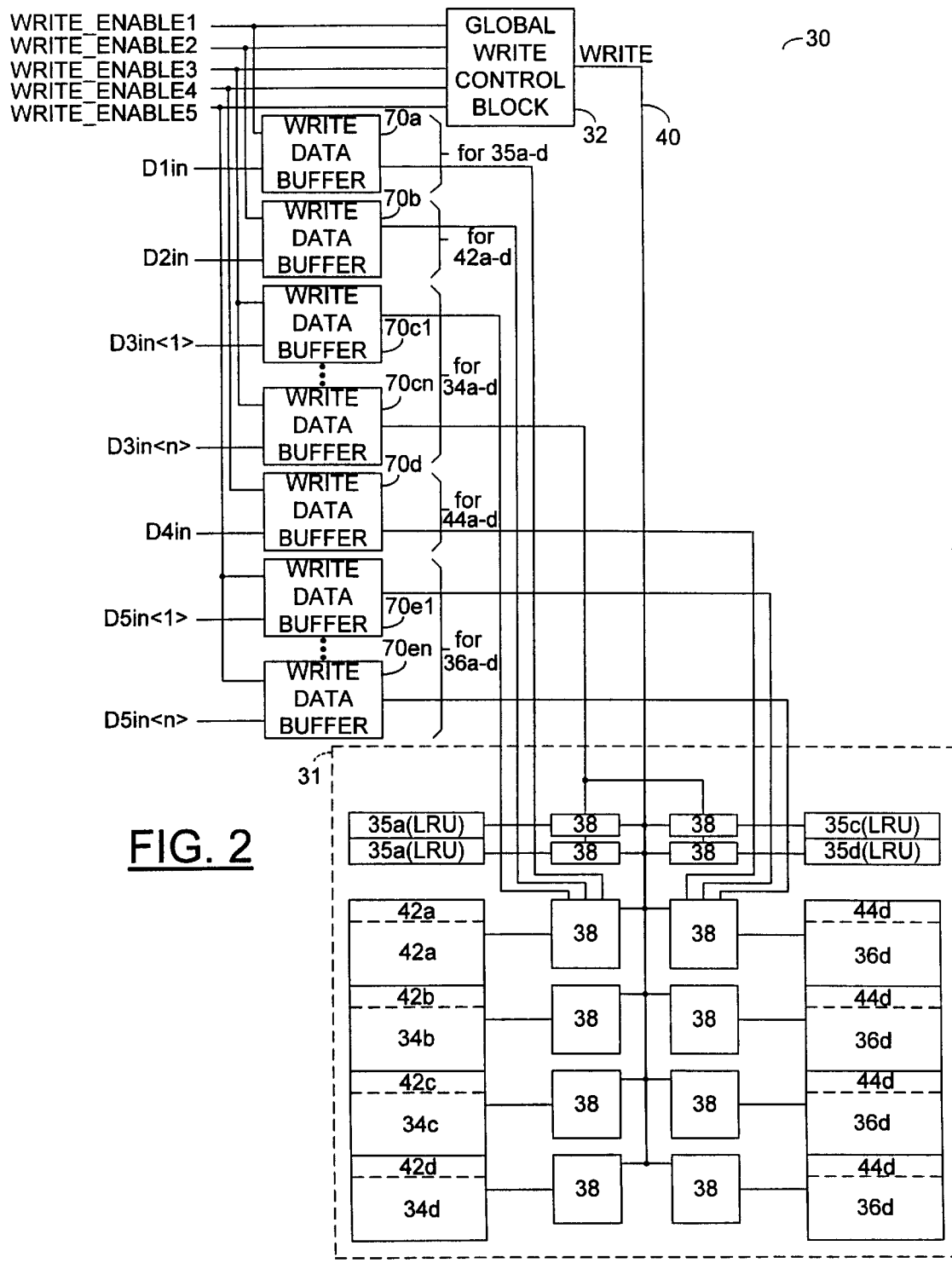
FIG. 2 is a block diagram illustrating the present invention implemented in a tag SRAM environment.

Referring to FIG. 2, a block diagram of a circuit 30 is shown in accordance with a preferred embodiment of the present invention. The circuit 30 generally comprises a memory array 31 and a global write control block 32. The memory array 31 generally comprises a number of tag groups 34a, 34b, 34c and 34d, a number of tag groups 35a, 35b, 35c and 35d, a number of tag groups 36a, 36b, 36c and 36d and a number of local decode and write control logic blocks 38. A number of write enable signals WRITE_ENABLE1, WRITE_ENABLE2, WRITE_ENABLE3, WRITE_ENABLE4 and WRITE_ENABLE5 are generally presented to the global write control block 32. The global write control block 32 presents a global write enable signal WRITE on a line 40 that is presented to each of the local decode and write control logic blocks 38 for the particular tag groups 34a~34d, 35a~35d and 36a~36d to be written with data. The local decode and write control blocks 38 generally provide local write decoding and column selection.

The tag groups 34a~34d may represent a bank "0" of an overall implementation of the tag memory array 31. The tag groups 36a~36d may represent a bank "1" of an overall implementation of the tag memory array 31. To illustrate the multi-functioning nature of the circuit 30, the tag groups 35a~35d are generally indicated as least recently used (LRU) tag groups. A number of multi-use address data/dirty bit locations 42a, 42b, 42c, 42d, 44a, 44b, 44c and 44d are also shown for example purposes. The number of dirty bit locations 42a~42d and 44a~44d, as well as the number of tag groups 34a~34d, 35a~35d and 36a~36d, may be expanded or reduced to any number required to meet the design criteria of a particular application. The ability to share a common global write enable signal WRITE becomes desirable with the various multi-functioning bits in the circuit 30. Using previous techniques, each different functioning tag group 34a~34d, 35a~35d, 36a~36d, 42a~42d and 44a~44d would generally require an independently generated write enable signal.

The circuit 30 also comprises a write data buffer 70a, 70b, 70c1~70n1, 70d and 70e1~70en. The write data buffer 70a is shown receiving the write enable signal WRITE_ENABLE1, the write data buffer 70b is shown receiving the write enable signal WRITE_ENABLE2, the write data buffers 70c1~70cn are shown receiving the write enable signal WRITE_ENABLE3, the write data buffer 70d is shown receiving the write enable signal WRITE_ENABLE4 and the write data buffers 70e1~70en are shown receiving the write enable signal WRITE_ENABLE5. More write data buffers 70a~70en may be implemented to meet the design criteria of a particular application. The write data buffers 70a~70en present write data lines that are generally received by the local decode and write control logic blocks 38.

The write data buffer 70a generally presents data lines to the local decode and write control logic bocks 38 of the tag groups 35a~35d. The write data buffers 70b and 70c1~70cn generally present data lines to the local decode and write control logic blocks 38 of the tag groups 34a~34d and 42a~42d. The write data buffers 70d and 70e1~70en generally present data lines to the local decode and write control logic blocks 38 of the tag groups 36a~36d and 44a~44d. The particular write data buffers 70a~70en that present data lines to the particular tag groups 34a~34d, 35a~35d, 36a~36d, 42a~42d and 44a~44d may be adjusted to meet the design criteria of a particular application. Similarly, the write enable signals WRITE_ENABLE1~5 may control the particular write data buffers 70a~70en may be adjusted to meet the design criteria of a particular application. The data input signals D1IN~D5IN(n) may be presented to more than one of the write data blocks 70a~70en for particular design applications. For example, the signal D2IN may be presented to the write enable buffers 70b, 70d or any other write enable buffer 70a~70en.

Figure 3:
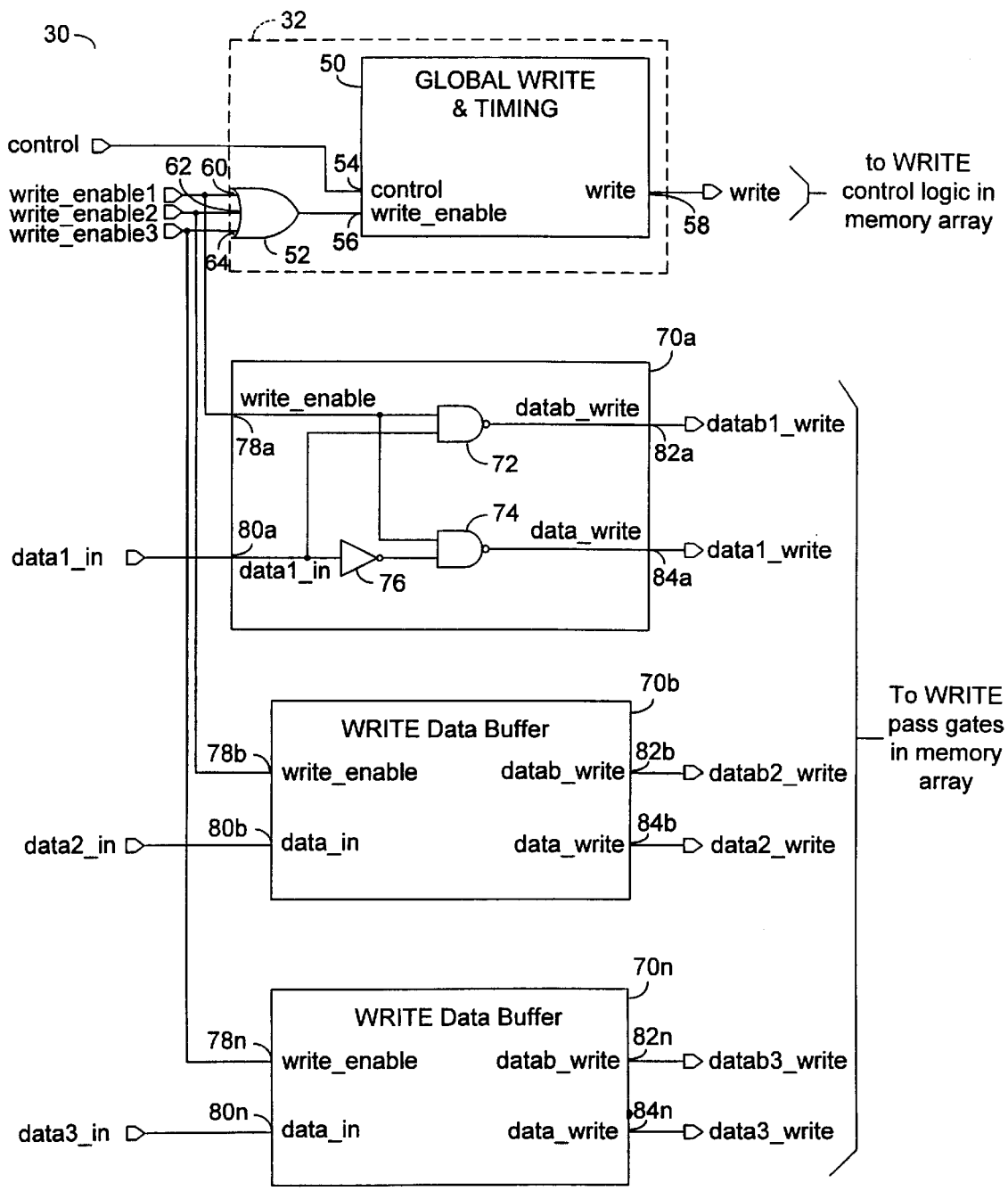
FIG. 3 is a block diagram illustrating the structure of the present invention.

Referring to FIG. 3, the write control portions of the circuit 30 are shown in greater detail. The global write control block 32 generally comprises a global write control and timing block 50 and a gate 52. The gate 52 may be implemented as an OR gate or any other gate that combines the various write enable signals in a similar fashion as an OR gate. For example, when one or more inputs are active (or at a first state) the output of the gate 52 is generally active. The global write control and timing block 50 generally comprises an input 54, an input 56 and an output 58. The input 54 generally receives a signal CONTROL. The input 56 generally receives a signal WRITE_ENABLE. The output 58 generally presents the global write enable signal WRITE that may be used by the local decode and write control logic blocks 38 of the memory array 31. The input 56 generally receives the signal WRITE_ENABLE from the gate 52. The signal CONTROL generally represents a chip select signal used by the global write control and timing block 50.

The gate 52 generally has an input 60, an input 62 and an input 64. The input 60 may receive a signal WRITE_ENABLE1, the input 62 generally may receive a signal WRITE_ENABLE2 and the input 64 generally may receive a signal WRITE_ENABLE3. The example shown in FIG. 3 illustrates three write enable signals WRITE_ENABLE1~3 presented to the global write control block 32. However, the number of write enable signals WRITE_ENABLE1~3 may be expanded to any number to meet the design criteria of a particular application. Specifically, any number of write enable signals WRITE_ENABLE1~3 may be presented to the gate 52. Additional write enable signals WRITE_ENABLE1~3 may be necessary for the addition of more dirty bits, more least recently used bits or other multi-functioning bits. The separate write enable signals WRITE-ENABLE1~3 are generally connected to a different set of write data buffers 70a~70n.

The circuit 30 further comprises a number of write data buffers 70a, 70b and 70n. The number of write data buffers 70a~70n that are implemented depends on the number of write enable signals WRITE_ENABLE1~3 presented to the global write control block 32. Each write enable may control more than one write data buffer 70a~70n depending on how many bits are in each data partition. The write data buffer 70a generally comprises a NAND gate 72, a NAND gate 74 and an inverter 76. The write data buffer 70a has an input 78a that may receive the signal WRITE_ENABLE1 and an input 80 that may receive a signal DATA1_IN. The signal WRITE_ENABLE1 may be presented to an input of the NAND gate 72 as well as to an input of the NAND gate 74. The signal DATA1_IN may be presented to a second input of the NAND gate 72 as well as to an inverter 76. The inverter 76 is generally coupled to a second input of the NAND gate 74. The output of the NAND gate 72 presents a signal DATAB1_WRITE to an output 82a of the write data buffer 70a. The NAND gate 74 may present a signal DATA1_WRITE to an output 84a of the write data buffer 70a. The NAND gate 72, the NAND gate 74 and the inverter 76 may be adjusted to fit the design criteria of a particular application provided that the proper logic function is realized at the outputs 82a and 84a.

The write data buffers 70b~70n are implemented similarly to the write data buffer 70a. The outputs 82a~82n and 84a~84n represent the signals DATAB1_WRITE and DATA1_WRITE for the write data buffer 70a, the signals DATAB2_WRITE and DATA2_WRITE for the write data buffer 70b and the signals DATA3_WRITE and DATA3_WRITE for the write data buffer 70n. The signals from the write data buffers 70a~70n are generally used by the write pass gates (not shown) to control writing to the memory array 31. The signal WRITE activates the writing of each of the particular data partitions at the same time. The particular bits that are written to are generally determined by when one of the signals DATAB_WRITE or DATA_WRITE is driven to a "0" (i.e., an active state) during the write operation. Otherwise, the bits of the memory array 31 are not written to since both DATAB_WRITE and DATA_WRITE are both driven to a inactive state (e.g., a "1"). The logic of the particular write data buffer 70*a*~70*n* insures the proper functioning of the signals DATAB_WRITE and DATA_ WRITE when the appropriate write enable signal WRITE_ -ENABLE1~3 is asserted. When the signal WRITE is not asserted, the state of the signals DATAB_WRITE and DATA_WRITE generally do not determine the writing of the memory array. The writing of the memory array 31 generally requires that the signal WRITE is asserted as well as one of the signals DATAB_WRITE and DATA_WRITE is active (e.g., driven to a "0") . While any one of the write enable signals WRITE_ENABLE1~3 may activate the signal WRITE, only one of the write enable signals WRITE_ ENABLE1~3 may activate a particular write data buffer 70*a*~70*n* to drive the particular signals DATA_WRITE or DATAB_WRITE to a "0".

The memory array 31 may be implemented as an SRAM array configured as a tag that is used to store upper address bits of main memory locations. The upper address bits generally point to particular locations in the main memory (not shown) that may be accessed during a cache hit. The data stored in the main memory may be the data corresponding to address locations stored in the tag, which generally indicates what is stored in the cache memory. When a particular main memory location is mapped to more than one cache location (i.e., the cache is multi-way set associative), it is generally necessary for the tag ram to store more than one set of upper address bits for each low-order address location.

The circuit 30 generally provides a scheme for segmenting the writes to the tag data that may be functionally divided on a bit by bit basis, if necessary. The data at any memory location from the main memory may be stored in one of two locations in the cache memory. This is generally referred to in the memory art as 2-way set associative mapping. The tag groups 34*a*~34*d*, 35*a*~35*d*, 36*a*~36*d*, 42*a*~42*d* and 44*a*~44*d* generally represent different subsets of data that each may be globally controlled by the global write enable signal WRITE present at the output 40 for writing to the memory array 31. Whenever there is a cache read hit, the least recently used (LRU) bit is generally required to be updated.

The circuit 30 also provides a timing of the writing for a particular location in the memory array 31 by providing a global write enable signal WRITE that drives the entire memory array 31. This provides a timing benefit that is not realized when implementing a separate write enable for each particular tag group 34*a*~34*d*, 35*a*~35*d*, 36*a*~36*d*, 42*a*~42*d* and 44*a*~44*d*. The global write enable WRITE minimizes the number of routes that are necessary to be implemented on the circuit 30 to control the particular tag groups 34*a*~34*d*, 35*a*~35*d*, 36*a*~36*d*, 42*a*~42*d* or 44*a*~44*d*.

Figure 4A:
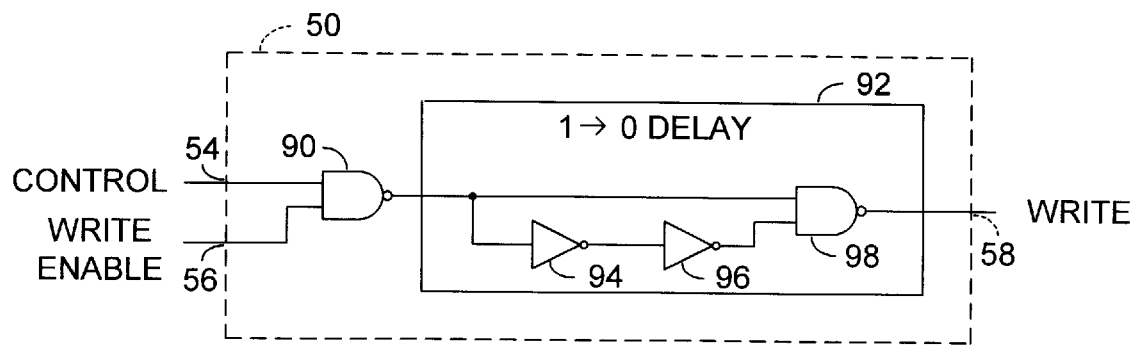
FIG. 4A is a block diagram of a global write control and timing block of the present invention.
Figure 4B:
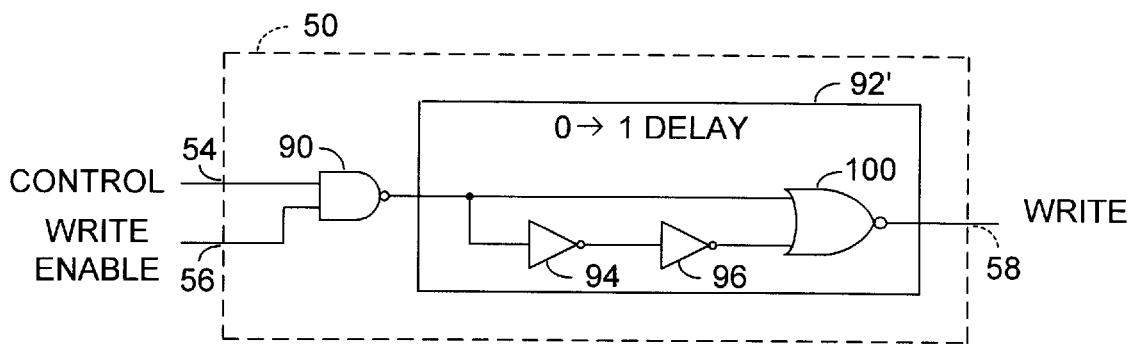
FIG. 4B is a block diagram of an alternate global write control and timing block of the present invention.

Referring to FIG. 4A, a diagram of the global write control and timing block 50 is shown. The block 50 generally comprises a NAND gate 90 and an inverter block 92. The NAND gate 90 may receive the signal CONTROL from the input 94 and the signal WRITE_ENABLE from the input 56. The NAND gate 90 may present an output to the delay block 92. The delay block 92 generally comprises an inverter 94, an inverter 96 and an inverter 98. The output of the NAND gate 90 is generally presented to an input of the NAND gate 98 as well as to the inverter 94. The inverter 94 may present a signal to the inverter 96. The inverter 96 is generally coupled to the NAND gate 98. The NAND gate 98 generally presents the signal WRITE at the output 58. FIG. 4B provides an alternate implementation for the global write control and timing block 50. The NAND gate 98 is generally substituted with a NOR gate 100. The delay block 92 and the delay block 92' may be implemented as any type of delay that provides a fixed amount of delay between an input and an output. The signal CONTROL received at the input 54 may be used to gate the individual write enable signals WRITE_ENABLE1~3 prior to their combination in the gate 52. The signal CONTROL may be implemented as a chip enable signal or as a RAM enable signal for an embedded RAM. It may be desirable in some design applications to omit the signal CONTROL at the input 54.

The invention has been described in connection with a tag RAM memory. However, the present invention may be implemented in any memory architecture where multifunctioning bits require a global write enable signal. The present invention may also be used in an SRAM application where only particular bits are selected to be written. Additionally, the present invention may be used in single bit write applications, such as writing a parity bit.

While the invention has been particularly shown and described with reference to the preferred embodiments thereof, it will be understood by those skilled in the art that various changes in form and details may be made without departing from the spirit and scope of the invention.

We claim:

1. A circuit comprising:

a control block configured to receive a plurality of enable signals and to generate a global write enable signal;

a number of memory groups configured to have information written when receiving said global write enable signal; and a plurality of write data buffers each configured to receive (i) one of said enable signals and (ii) a data input signal, wherein each of said write data buffers presents a first and second data write signal used to write said data input signal to one or more of said memory groups, wherein one or more write data buffers may receive a particular one of said enable signals, wherein said first and second data write signals are driven to an inactive state when said particular enable signal is inactive.

2. The circuit according to claim 1 wherein said memory groups comprise a device selected from the group consisting of a cache memory, an SRAM memory and a tag SRAM memory.

3. The circuit according to claim 2 wherein said memory groups comprise a number of tag groups configured to store upper address bits of main memory data locations stored in the cache.

4. The circuit according to claim 1 wherein said control block comprises:

a logic gate configured to (i) receive said plurality of enable signals and (ii) present an output; and a logic block for receiving said output from said logic gate.

5. The circuit according to claim 4 wherein said logic gate presents said output when one or more of said enable signals are active.

6. The circuit according to claim 4 wherein said control block further comprises a control signal configured to enable said control block.

7. A circuit comprising:

control means for receiving a plurality of enable signals and for generating a global write enable signal;

memory means for writing information when said global write enable signal is received; and buffer means for receiving (i) one of said plurality of enable signals and (ii) a data input signal, wherein said buffer means presents a first and second data write signal used to write said data input signal to said memory means, wherein one or more write data buffers may receive a particular one of said enable signals, wherein said first and second data write signals are driven to an inactive state when said particular enable signal is inactive.

8. The circuit according to claim 7 wherein said memory means comprises a device selected from the group consisting of a cache memory, an SRAM memory and a tag SRAM memory.

9. The circuit according to claim 8 wherein said memory means comprises a number of tag groups configured to store upper address bits of main memory data locations stored in the cache.

10. The circuit according to claim 7 wherein said control means comprises:

first logic means for receiving said plurality of enable signals; and second logic means for receiving an output from said first logic means.

11. The circuit according to claim 10 wherein first logic means presents an output when one or more of said enable signals are active.

12. The circuit according to claim 11 wherein said control means further comprises a control signal configured to enable said control means.

13. A method for generating a global write control signal comprising the steps of:

receiving a plurality of enable signals;

generating a global write enable signal in response to said plurality of enable signals, wherein a number of memory groups are configured to have information written when receiving said global write enable signal; and receiving (i) one of said plurality of enable signals and (ii) a data input signal by a buffer, wherein said buffer presents a first and second data write signal used to write said data input signal to one or more of said memory groups, wherein one or more buffers may receive a particular one of said enable signals, wherein said first and second data write signals are driven to an inactive state when said particular enable signal is inactive.

14. The method according to claim 13 further comprising the step of:

receiving said plurality of enable signals by one or more logic gates, wherein said one or more logic gates provide said global write enable signal.

15. The method according to claim 14 wherein said one or more logic gates comprises an OR gate.

16. The method according to claim 14 further comprising the step of:

generating a control signal configured to enable said global write enable signal.

* * * * *